United States Patent [19]

Neumann

[11] Patent Number: 5,674,661
[45] Date of Patent: Oct. 7, 1997

[54] IMAGE DYE FOR LASER DYE REMOVAL RECORDING ELEMENT

[75] Inventor: Stephen Michael Neumann, Rochester, N.Y.

[73] Assignee: Eastman Kodak Company, Rochester, N.Y.

[21] Appl. No.: 564,834

[22] Filed: Nov. 29, 1995

Related U.S. Application Data

[60] Provisional application No. 60/006,091, Oct. 31, 1995.
[51] Int. Cl.$^6$ ..................................................... G03C 5/16
[52] U.S. Cl. ........................... 430/270.1; 430/270.15; 430/945; 430/200; 503/227
[58] Field of Search .................... 503/227; 430/270.1, 430/200, 201, 199, 945, 944, 270.11, 270.15; 8/471; 534/561, 563

[56] References Cited

U.S. PATENT DOCUMENTS

| | | | |
|---|---|---|---|
| 4,735,889 | 4/1988 | Namba et al. | 430/270.19 |
| 4,753,922 | 6/1988 | Byers et al. | 503/227 |
| 4,855,281 | 8/1989 | Byers | 503/227 |
| 4,973,572 | 11/1990 | DeBoer | 503/227 |
| 4,977,135 | 12/1990 | Bradbury et al. | 503/227 |
| 5,036,040 | 7/1991 | Chapman et al. | 430/200 |
| 5,354,725 | 10/1994 | Eguchi et al. | 503/227 |
| 5,387,496 | 2/1995 | DeBoer | 430/945 |
| 5,468,591 | 11/1995 | Pearce et al. | 430/945 |
| 5,491,045 | 2/1996 | DeBoer et al. | 430/945 |

OTHER PUBLICATIONS

Colour Index, Third Ed. (1973) pp. 4225, 4226, 4228, 4229, 4239–4244 and 4245–4247.

*Primary Examiner*—Martin Angebranndt
*Attorney, Agent, or Firm*—Harold E. Cole

[57] ABSTRACT

A laser dye removal recording element comprising a support having thereon a dye layer comprising an image dye dispersed in a polymeric binder, the dye layer having an infrared-absorbing material associated therewith, and wherein the image dye comprises a cyan disazo dye having the following formula:

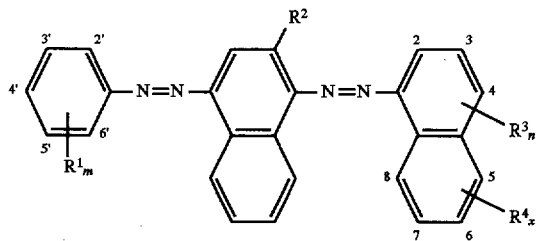

wherein:

$R^1$, $R^3$, and $R^4$ each independently represents nitro, hydroxy, alkyl, aryl, fused aryl, fused heteroaryl, carboxy, alkylcarbonyl, arylcarbonyl, hydrogen, alkenyl, cycloalkyl, haloalkyl, cyanoalkyl, hydroxyalkyl, alkoxy, alkoxyalkyl, aryloxyalkyl, alkoxyalkylcarbonyl, aryloxyalkylcarbonyl, alkoxyalkoxyalkyl, hydroxyalkyl, hydroxyalkoxyalkyl, hydroxyalkoxyalkylamino, alkenyloxyalkyl, alkoxycarbonyloxyalkyl, alkenylcarbonyl, aryloxyalkylcarbonyl, aminoalkyl, cyanoalkylcarbonyl, haloalkylcarbonyl, alkylamino, arylamino, amino, halogen, sulfonamido or arylazo;

or $R^3$ and $R^4$ can be joined together at the 4- and 5-positions of the ring to form a diaminoalkylene group;

$R^2$ represents hydroxy, hydrogen, alkyl or aryl;

m is an integer of from 1 to 5;

n is an integer of from 1 to 3; and x is an integer of from 1 to 4.

4 Claims, No Drawings

IMAGE DYE FOR LASER DYE REMOVAL RECORDING ELEMENT

CROSS REFERENCE TO RELATED APPLICATION

Reference is made to and priority claimed from U.S. Provisional application Ser. No. 60/006,091, filed 31, Oct. 1995, entitled IMAGE DYE FOR LASER DYE REMOVAL RECORDING ELEMENT.

This invention relates to use of a certain image dye in a single-sheet laser dye removal recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In another mode of imaging by the action of a laser beam, an element with a dye layer composition comprising an image dye, an infrared-absorbing material, and a binder coated onto a substrate is imaged from the dye side. The energy provided by the laser drives off at least the image dye at the spot where the laser beam impinges upon the element. In this mode of imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. Usefulness of such an element is largely determined by the efficiency at which the imaging dye can be removed on laser exposure. The transmission Dmin value is a quantitative measure of dye clean-out: the lower its value at the recording spot, the more complete is the attained dye removal.

In U.S. Pat. No. 5,491,045, a single-sheet laser dye-ablative recording element is described which employs an ultraviolet-absorbing dye in combination with a yellow dye and an anthraquinone cyan dye. However, there is a problem with this dye combination in that when elements of this type are exposed to plasticizing agents, such as human finger oil or acetone vapor, pronounced crystallization of the anthraquinone dye occurs.

It is an object of this invention to provide dyes which have been found to be significantly more resistant to crystallization than the previously-mentioned anthraquinone dyes. It is another object of this invention to provide a single-sheet process which does not require a separate receiving element.

These and other objects are achieved in accordance with the invention which comprises a laser dye removal recording element comprising a support having thereon a dye layer comprising an image dye dispersed in a polymeric binder, the dye layer having an infrared-absorbing material associated therewith, and wherein the image dye comprises a cyan disazo dye having the following formula:

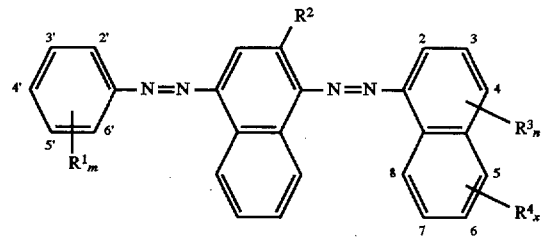

wherein:

R$^1$, R$^3$, and R$^4$ each independently represents nitro, hydroxy, alkyl, aryl, fused aryl, fused heteroaryl, carboxy, alkylcarbonyl, arylcarbonyl, hydrogen, alkenyl, cycloalkyl, haloalkyl, cyanoalkyl, hydroxyalkyl, alkoxy, alkoxyalkyl, aryloxyalkyl, alkoxyalkylcarbonyl, aryloxyalkylcarbonyl, alkoxyalkoxyalkyl, hydroxyalkoxyalkyl, hydroxyalkoxyalkylamino, alkenyloxyalkyl, alkoxycarbonyloxyalkyl, alkenylcarbonyl, aryloxyalkylcarbonyl, aminoalkyl, cyanoalkylcarbonyl, haloalkylcarbonyl, alkylamino, arylamino, amino, halogen, sulfonamido or arylazo;

or R$^3$ and R$^4$ can be joined together at the 4- and 5- positions of the ring to form a diaminoalkylene group;

R$^2$ represents hydroxy, hydrogen, alkyl or aryl;

m is an integer of from 1 to 5;

n is an integer of from 1 to 3; and x is an integer of from 1 to 4.

In a preferred embodiment of the invention, in the above formula, R$^1$ and R$^2$ are both hydrogen, R$^3$ and R$^4$ are joined together at the 4- and 5- positions of the ring to form a diaminoalkylene group, n and x are both 1 and m is 5.

Specific examples of cyan disazo dyes according to the above formula include the following:

| | $R^1$ | m | $R^2$ | $R^3$ | n | $R^4$ | x |
|---|---|---|---|---|---|---|---|
| A | H | 5 | H | $R^3$ and $R^4$ joined together to form $N(H)C(CH_3)_2(H)N-$ with n and x = 1 | | | |
| B | 4'-$NO_2$ | 1 | H | 4-OH | 1 | H | 1 |
| C | 4'-$NO_2$ | 1 | H | 4-$NH_2$ | 1 | H | 1 |
| D | 2'-OH, 3'-$NH_2$, 5'-$NO_2$ | 3 | —OH | 2-OH | 1 | H | 1 |
| E | 2'-OH, 3'-$NH_2$, 5'-$NO_2$ | 3 | —OH | 2-OH | 1 | 6-$SO_2-N(CH_2-CH_2OH)_2$ | 1 |
| F | 4'-$CH_2CH_2OH$ | 1 | H | 4-$NH_2$ | 1 | 8-OH | 1 |
| G | 2',4'-$NO_2$ | 2 | H | 2-$OCH_2CH_2OH$ | 1 | H | 1 |
| H | 2',3'-$C_4H_4$ | 2 | H | H | 1 | H | 1 |
| I | 2',4'-$NO_2$, 5'-Br | 3 | H | 4-$CH_2CH(OH)-CH_2OH$ | 1 | H | 1 |
| J | 4'-OH | 1 | H | 2-OH, 3-$C(O)NH-C_6H_4NO_2$ | 2 | H | 1 |
| K | 2'Cl, 4'-$NO_2$ | 2 | $CH_3$ | 2-OH, 3-$CO_2H$ | 2 | H | 1 |
| L | 4'-N=N—naphthyl—OH | 1 | H | 4-OH | 1 | H | 1 |

In certain embodiments of the invention, other image dyes may be included with the cyan dye of the invention to provide other effects. For example, in a reprographic mask, a yellow dye and UV dye are used in exposing a photosensitive printing plate. However, images from such a dye combination are difficult to see. By adding the cyan dye of the invention to this dye combination, images now becomes easier to see and use in making the printing plate. In this embodiment, any yellow dye may be employed. For example, there may be employed dicyanovinylaniline dyes as disclosed in U.S. Pat. Nos. 4,701,439 and 4,833,123 and JP 60/28,451; merocyanine dyes as disclosed in U.S. Pat. Nos. 4,743,582 and 4,757,046; pyrazolone arylidene dyes as disclosed in U.S. Pat. No. 4,866,029; azophenol dyes as disclosed in JP 60/30,393; azopyrazolone dyes as disclosed in JP 63/182,190 and JP 63/182,191; pyrazolinedione arylidene dyes as disclosed in U.S. Pat. No. 4,853,366; azopyridone dyes as disclosed in JP 63/39,380; quinophthalone dyes as disclosed in EP 318,032; azodiaminopyridine dyes as disclosed in EP 346,729, U.S. Pat. No. 4,914,077 and DE 3,820,313; thiadiazoleazo dyes and related dyes as disclosed in EP 331,170, JP 01/225,592 and U.S. Pat. No. 4,885,272; azamethine dyes as disclosed in JP 01/176,591, EPA 279,467, JP 01/176,590, and JP 01/178,579; nitrophenylazoaniline dyes as disclosed in JP 60/31,565; pyrazolonethiazole dyes as disclosed in U.S. Pat. No. 4,891,353; arylidene dyes as disclosed in U.S. Pat. No. 4,891,354; and dicyanovinylthiazole dyes as disclosed in U.S. Pat. No. 4,760,049, the disclosures of which are hereby incorporated by reference.

The yellow dye or cyan disazo dye employed in the above embodiment of the invention may each be used at a coverage of from about 0.01 to about 1 g/m².

In another preferred embodiment of the invention, the dye layer also contains an ultraviolet-absorbing dye, such as a benzotriazole, a substituted dicyanobutadiene, an aminodicyanobutadiene, or any of those materials disclosed in Patent Publications JP 58/62651; JP 57/38896; JP 57/132154; JP 61/109049; JP 58/17450; or DE 3, 139,156, the disclosures of which are hereby incorporated by reference. They may be used in an amount of from about 0.05 to about 1.0 g/m².

The dye removal elements of this invention can be used to obtain medical images, reprographic masks, printing masks, etc. The image obtained can be a positive or a negative image. The dye removal process can generate either continuous (photographic-like) or halftone images.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high blue and UV Dmax. If it does not do this, the printing plate would not be developable to give regions which take up ink and regions which do not.

By use of this invention, a mask can be obtained which has enhanced resistance to defects from crystallized dye.

Any polymeric material may be used as the binder in the recording element employed in the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); polystyrene; poly (styrene-co-acrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 g/m².

In a preferred embodiment, the polymeric binder used in the recording element employed in the process of the invention has a polystyrene equivalent molecular weight of at least 100,000 as measured by size exclusion chromatography, as described in U.S. Pat. No. 5,330,876, the disclosure of which is hereby incorporated by reference.

A barrier layer may be employed in the laser dye removal recording element of the invention if desired, as described in U.S. Pat. No. 5,459,017, the disclosure of which is hereby incorporated by reference.

To obtain a laser-induced image according to the invention, an infrared diode laser is preferably employed since it offers substantial advantages in terms of its small size, low cost, stability, reliability, ruggedness, and ease of modulation. In practice, before any laser can be used to heat a dye removal recording element, the element must contain an infrared-absorbing material, such as cyanine infrared-absorbing dyes as described in U.S. Pat. No. 5,401,618 or other materials as described in U.S. Pat. Nos. 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat. The infrared-absorbing dye may be contained in the dye layer itself or in a separate layer associated therewith, i.e., above or below the dye layer. Preferably, the laser exposure in the process of the invention takes place through the dye side of the dye removal recording element, which enables this process to be a single-sheet process, i.e., a separate receiving element is not required.

Thus, a process according to the invention comprises imagewise-heating by means of a laser, a dye removal recording element as described above, the laser exposure taking place through the dye side of the element, and removing the ablated image dye material to obtain the image in the dye removal recording element.

Lasers which can be used in the invention are available commercially. There can be employed, for example, Laser Model SDL-2420-H2 from Spectra Diode Labs, or Laser Model SLD 304 V/W from Sony Corp.

The dye layer of the dye removal recording element of the invention may be coated on the support or printed thereon by a printing technique such as a gravure process.

Any material can be used as the support for the dye removal recording element of the invention provided it is dimensionally stable and can withstand the heat of the laser. Such materials include polyesters such as poly(ethylene naphthalate); polysulfones; poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyetherimides. The support generally has a thickness of from about 5 to about 200 μm. In a preferred embodiment, the support is transparent.

The following examples are provided to illustrate the invention.

EXAMPLE 1

The following materials were employed in this example:

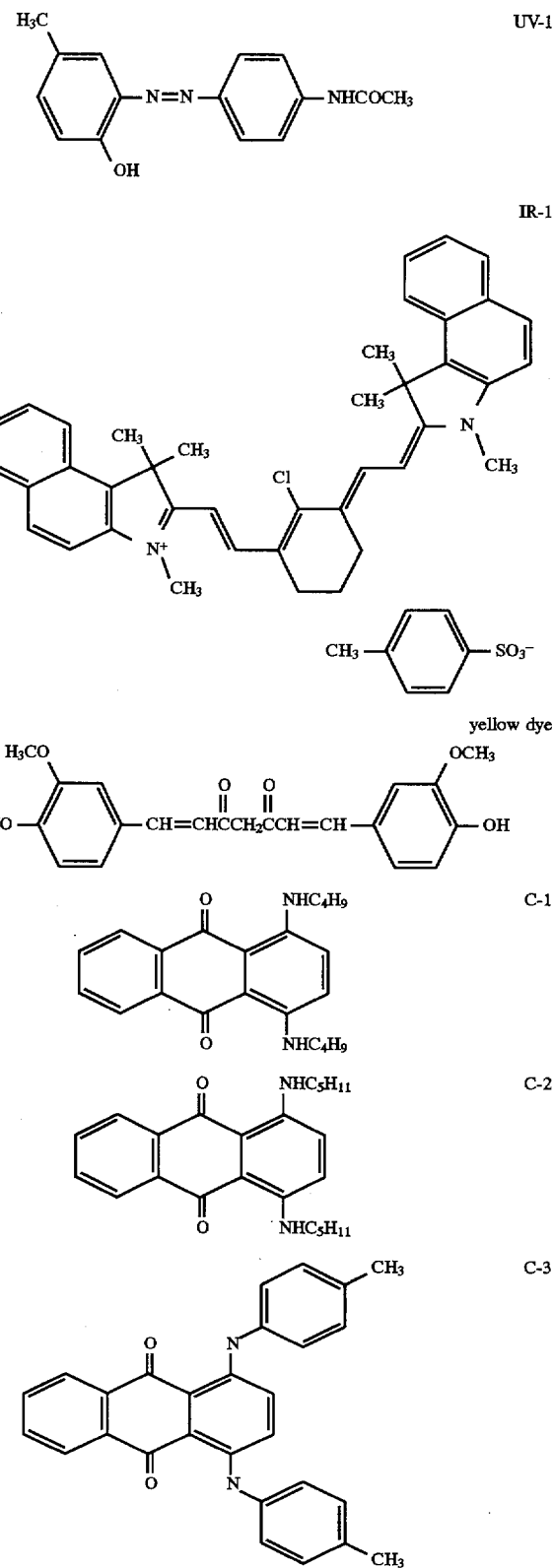

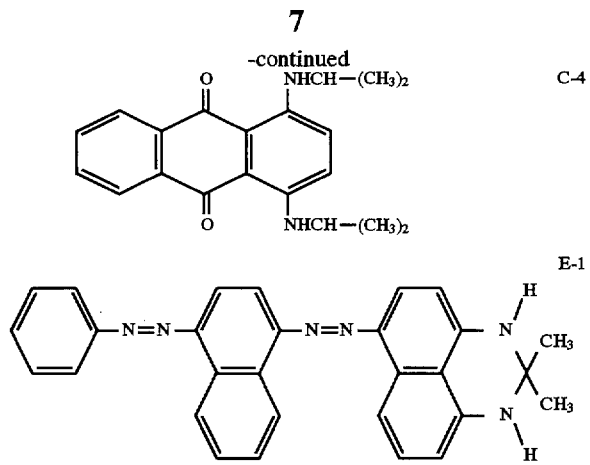

A 100 μm thick poly(ethylene terephthalate) support was coated with 0.38 g/m² of a copolymer of 70% ethylcyanolacrylate and 30% methylcyanoacrylate, 0.05 g/m² infrared dye IR-1, and 0.005 g/m² Fluorad FC-431® surfactant (3M Corp.) from a 50/50 blend of acetone/acetonitrile.

Samples of this support were then coated with a laser dye removal layer consisting of 0.22 g/m² infrared dye IR-1, 0.41 g/m² or 0.34g/m² ultraviolet dye UV-1, 0.14 g/m² or 0.11 g/m² yellow dye, 0.60 g/m² nitrocellulose, and the cyan dye E-1 or the comparison dyes C-1 through C-4 coated from an 80/20 (wt/wt) mixture of 4-methyl-2-pentanone/ethanol. The comparison dyes are cyan dyes as disclosed in U.S. Ser. No. 356,986 of DeBoer, et. al. Dye coverages were selected to afford constant UV and visible densities for each dye layer.

The laser dye removal layer was then overcoated with 0.11 g/m² of a copolymer of 62% ethylmethacrylate and 28% methacrylic acid, 0.03 g/m² Hydrocerf® 9174 polytetrafluoroethylene particles (Shamrock Co.), 0.05 g/m² Fluon AD-1® polytetrafluoroethylene particles (ICI Fluoropolymers Co.), and 0.008 g/m² Zonyl® FSN surfactant (DuPont Co.) coated from a 98.9/1.1 (wt/wt) water/1.5N ammonium hydroxide blend.

The resulting dye layers were exposed to acetone vapors for two minutes by placing them over the mouth of a glass jar containing acetone. Degree of crystal formation was determined subjectively by transmission optical microscopy. A qualitative scale was used to describe the degree of crystallization in which 10 represented massive crystallization observed at 100× magnification and 0 represented no crystals observed at 500× magnification. The following results were obtained:

TABLE 1

| UV-1 (g/m²) | Yellow Dye (g/m²) | Cyan Dye (g/m²) | Degree of Crystals Induced By Acetone Vapor |
|---|---|---|---|
| 0.34 | 0.11 | E-1 (0.23) | 0 |
| 0.41 | 0.14 | C-1 (0.38) | 10 |
| 0.41 | 0.14 | C-2 (0.44) | 10 |
| 0.41 | 0.14 | C-3 (0.42) | 9 |
| 0.41 | 0.14 | C-4 (0.35) | 8 |

The above results show the cyan disazo dye of the invention is far more resistant to crystallization than are the comparison anthraquinone cyan dyes.

EXAMPLE 2

A subset of the dye layers were fingerprinted and held at 120° F. (49° C.) for fourteen days. The layers were visually inspected (using a 7× magnifying loupe) to detect crystal formation. The presence or lack of crystals was noted. The following results were obtained:

TABLE 2

| UV-1 (g/m²) | Yellow Dye (g/m²) | Cyan Dye (g/m²) | Presence of Crystals Induced by Human Fingerprints |
|---|---|---|---|
| 0.34 | 0.11 | E-1 (0.23) | None |
| 0.41 | 0.14 | C-1 (0.38) | Crystals Present |
| 0.41 | 0.14 | C-2 (0.44) | Crystals Present |
| 0.41 | 0.14 | C-4 (0.35) | Crystals Present |

The above results also show the cyan disazo dye of the invention is more resistant to crystallization than are the comparison anthraquinone cyan dyes.

The invention has been described in detail with particular reference to preferred embodiments thereof, but it will be understood that variations and modifications can be effected within the spirit and scope of the invention.

What is claimed is:

1. A single sheet process of forming a dye image comprising imagewise-heating by means of a laser, a dye removal recording element comprising a support having thereon a dye layer comprising a cyan image dye, a yellow dye and an ultraviolet-absorbing dye which are dispersed in a polymeric binder, said dye layer having an infrared-absorbing material associated therewith, said laser exposure taking place through the dye side of said element, and removing the ablated image dye material to obtain said image in said dye removal recording element, and wherein said cyan image dye comprises a cyan disazo dye having the following formula:

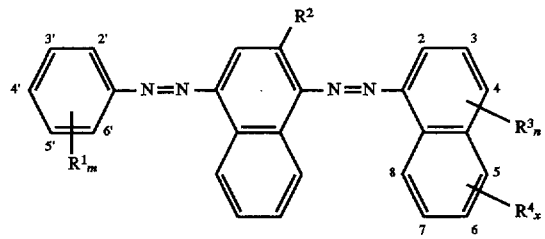

wherein:

$R^1$, $R^3$, and $R^4$ each independently represents nitro, hydroxy, alkyl, aryl, fused aryl, fused heteroaryl, carboxy, alkylcarbonyl, arylcarbonyl, hydrogen, alkenyl, cycloalkyl, haloalkyl, cyanoalkyl, hydroxyalkyl, alkoxy, alkoxyalkyl, aryloxyalkyl, alkoxyalkylcarbonyl, aryloxyalkylcarbonyl, alkoxyalkoxyalkyl, hydroxyalkoxyalkyl, hydroxyalkoxyalkylamino, alkenyloxyalkyl, alkoxycarbonyloxyalkyl, alkenylcarbonyl, aryloxyalkylcarbonyl, aminoalkyl, cyanoalkylcarbonyl, haloalkylcarbonyl, alkylamino, arylamino, amino, halogen, sulfonamido or arylazo;

or $R^3$ and $R^4$ can be joined together at the 4- and 5- positions of the ring to form a diaminoalkylene group;

$R^2$ represents hydroxy, hydrogen, alkyl or aryl;

m is an integer of from 1 to 5;

n is an integer of from 1 to 3; and x is an integer of from 1 to 4.

2. The process of claim 1 wherein $R^1$ and $R^2$ are both hydrogen, $R^3$ and $R^4$ are joined together at the 4- and 5-positions of the ring to form a diaminoalkylene group, n is 3, x is 4 and m is 5.

3. The process of claim 2 wherein said diaminoalkylene group is $N(H)C(CH_3)_2(H)N$.

4. The process of claim 1 wherein said infrared-absorbing material is a dye which is contained in said dye layer.

* * * * *